United States Patent [19]

Mouri

[11] Patent Number: 5,182,421
[45] Date of Patent: Jan. 26, 1993

[54] PRINTED WIRING BOARD WITH TEST PATTERN FOR THROUGH HOLES

[75] Inventor: Yoshitaka Mouri, Toyama, Japan

[73] Assignee: NEC Corporation, Tokyo, Japan

[21] Appl. No.: 845,019

[22] Filed: Mar. 3, 1992

[30] Foreign Application Priority Data

Mar. 11, 1991 [JP] Japan .................................... 3-43914

[51] Int. Cl.[5] .............................................. H05K 1/00
[52] U.S. Cl. .................................... 174/250; 174/262; 29/593; 29/709
[58] Field of Search ............... 174/250, 254, 255, 262; 361/397, 409; 29/598, 407, 709, 714; 324/158 F, 158 R; 33/555.1; 408/1, 2, 3, 13

[56] References Cited

U.S. PATENT DOCUMENTS

| | | | |
|---|---|---|---|
| 4,208,783 | 6/1980 | Luther et al. | 29/593 |
| 4,510,446 | 4/1985 | Braun et al. | 324/158 R |
| 4,748,773 | 6/1988 | Dawson et al. | 29/593 X |
| 4,878,315 | 11/1989 | Dawson et al. | 29/593 X |

Primary Examiner—Leo P. Picard
Assistant Examiner—Trinidad Korka
Attorney, Agent, or Firm—Leydig, Voit & Mayer

[57] ABSTRACT

A printed wiring board comprises a board member having a major surface virtually broken down into a first zone and a second zone, and at least one through-hole of a predetermined diameter is open at the first zone of the major surface, wherein an electrically conductive test pattern with a first conductive sub-pattern and a second conductive sub-pattern spaced apart from each other is formed on the second zone of the major surface, a first test hole of the first predetermined diameter being formed in the first conductive sub-pattern in such a manner as to split the first conductive sub-pattern into two disconnected pieces without breakage of the second conductive sub-pattern in so far as the first predetermined diameter is matched with a design specification, thereby easily checking the at least one through-hole by using current to see whether or not the predetermined diameter is correct.

5 Claims, 5 Drawing Sheets

5,182,421

PRINTED WIRING BOARD WITH TEST PATTERN FOR THROUGH HOLES

FIELD OF THE INVENTION

This invention relates to a printed wiring board and, more particularly, to a test pattern on the printed wiring board for through holes.

DESCRIPTION OF THE RELATED ART

A typical example of the printed wiring board is illustrated in FIG. 1, and various through-holes $1a$, $1b$ and $1c$ are formed through a rigid board member 2. The through-holes $1a$ to $1c$ are different in inside diameter from one another, and are open to a central zone $2a$ of a major surface of the rigid board member 2. The manufacturer needs to precisely form the through-holes $1a$ to $1c$ of designated sizes at assigned points on the major surface, and inappropriate through-holes make the printed wiring board defective. In order to deliver the defective products, the manufacturer checks the through-holes $1a$ to $1c$ to see whether or not the through-holes $1a$ to $1c$ are formed in designated sizes, and test holes $3a$, $3b$ and $3c$ are formed in a peripheral zone $2b$ of the major surface at the same time of forming the through-holes $1a$ to $1c$. In the testing stage, an operator inserts a plug gage into the test holes $3a$ to $3c$ to see whether or not the through-holes $1a$ to $1c$ are formed in designated sizes.

However, the prior art test consumes time and labor, and, accordingly, is expensive. Moreover, to err is human, and defective products are liable to be delivered.

SUMMARY OF THE INVENTION

It is therefore an important object of the present invention to provide a printed wiring board which is free from the problems inherent in the prior art printed wiring board.

To accomplish the object, the present invention proposes to form an electrically conductive test pattern on a major surface of a printed wiring board.

In accordance with the present invention, there is provided a printed wiring board comprising a) a board member having a major surface virtually broken down into a first zone and a second zone, at least one through-hole being open at the first zone of the major surface, the at least one through-hole having a first predetermined diameter; and b) an electrically conductive test pattern formed on the second zone of the major surface, and having a first conductive sub-pattern and a second conductive sub-pattern spaced apart from each other by a first predetermined gap, a first test hole of the first predetermined diameter being formed in the first conductive sub-pattern in such a manner as to split the first conductive sub-pattern into two disconnected pieces without breakage of the second conductive sub-pattern in so far as the first predetermined diameter is matched with a design specification.

BRIEF DESCRIPTION OF THE DRAWINGS

The features and advantages of the printed wiring board according to the present invention will be more clearly understood from the following description taken in conjunction with the accompanying drawings in which.

DESCRIPTION OF THE PREFERRED EMBODIMENTS

First Embodiment

Figure 1:
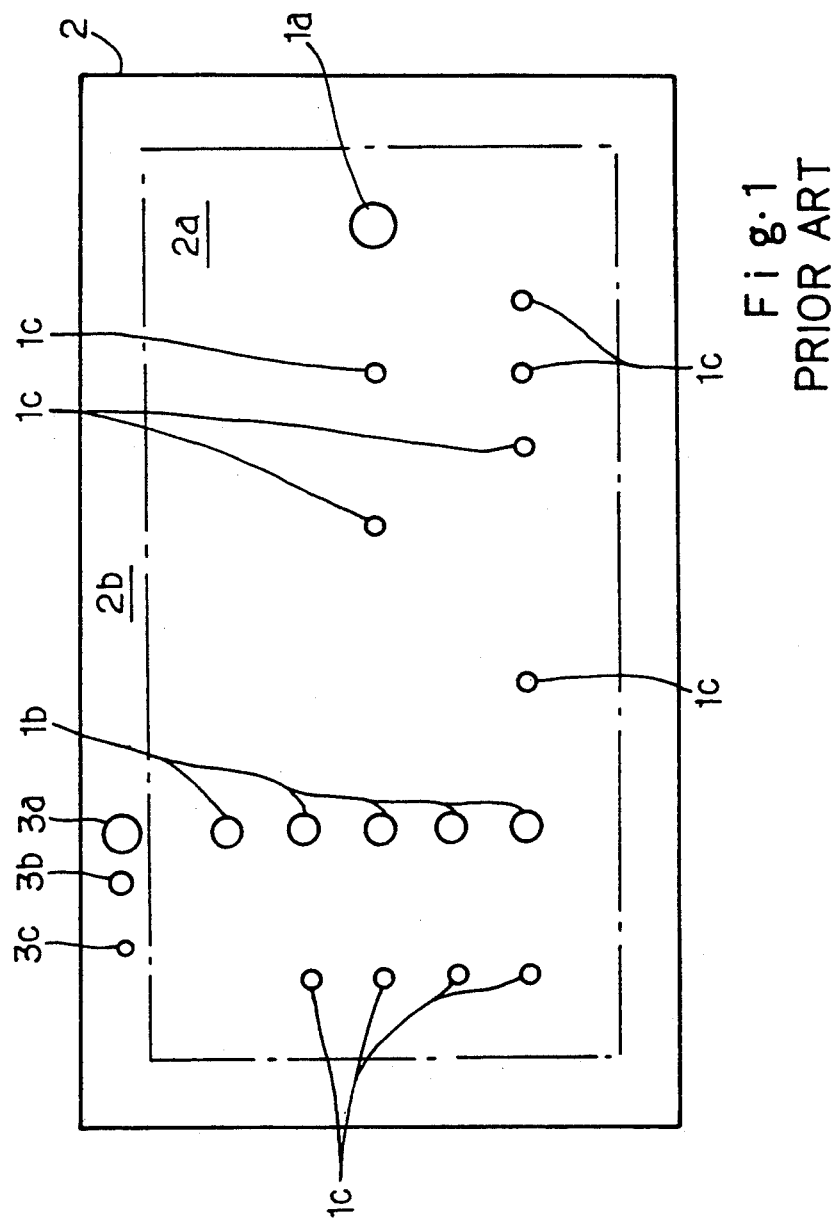
FIG. 1 is a plan view showing the prior art printed wiring board.
Figure 2:
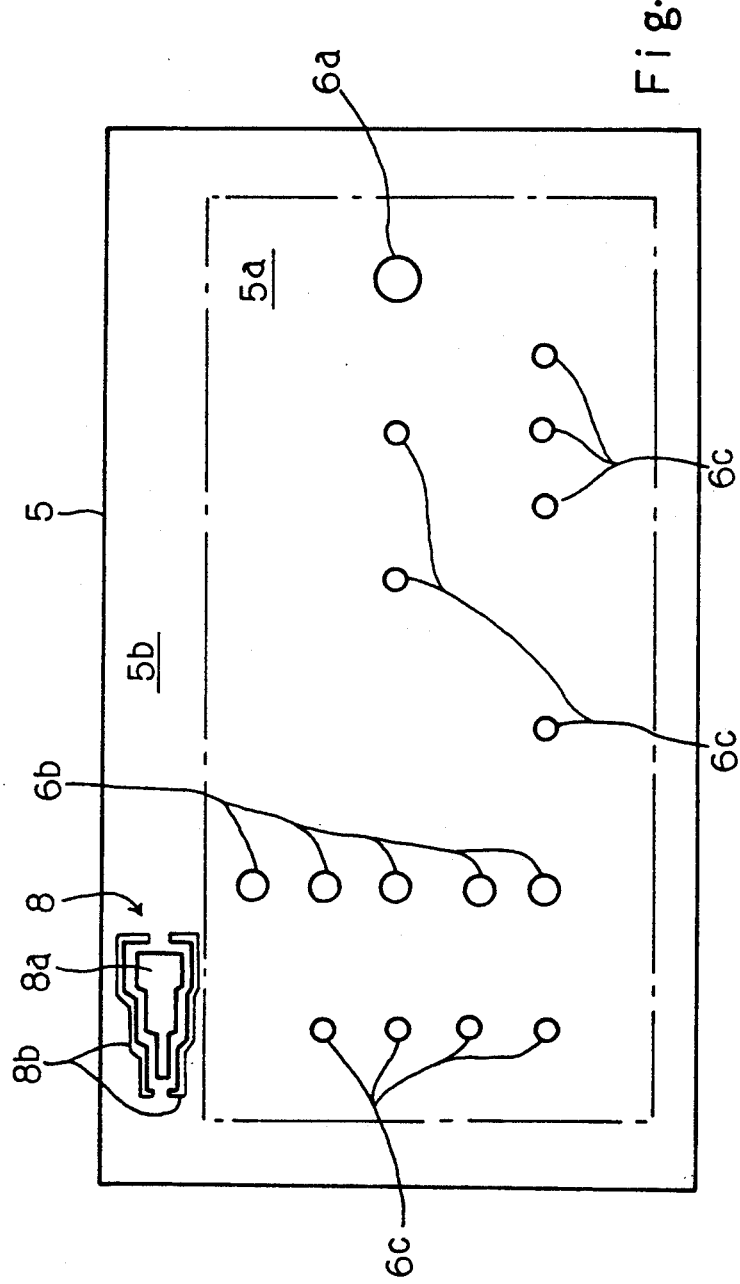
FIG. 2 is a plan view showing a printed wiring board according to the present invention.

Referring first to FIG. 2 of the present invention, a rigid board member 5 has a major surface which is virtually broken down into a central zone $5a$ and a peripheral zone $5b$. Various through-holes $6a$, $6b$ and $6c$ are formed through the rigid board member 5 in accordance with a design specification 7, and are open at both ends thereof to the major surfaces of the rigid board member 5. An electrically conductive test pattern 8 is formed in the peripheral zone $5b$, and has an inner conductive sub-pattern $8a$ and an outer conductive sub-pattern $8b$ outside the inner conductive sub-pattern $8a$.

Figure 3:
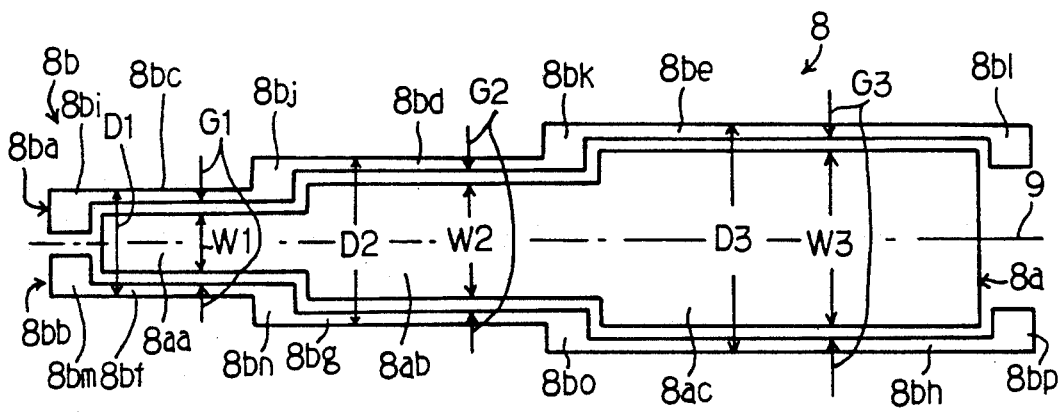
FIG. 3 is a plan view showing the configuration of an electrically conductive test pattern formed on the major surface of the printed wiring board shown in FIG. 2.

The electrically conductive test pattern 8 is illustrated in an enlarged scale in FIG. 3. The inner conductive sub-pattern $8a$ has a center axis 9, and is substantially symmetrical with respect to the center axis 9. The inner conductive sub-pattern $8a$ is divided into three sections, i.e., a narrow section $8aa$ having a first predetermined width W1, an intermediate section $8ab$ having a second predetermined width W2 and a wide section $8ac$ having a third predetermined width W3, and is stepwise increased in width from the left side to the right side. The outer conductive sub-pattern $8b$ is formed by two conductive strips $8ba$ and $8bb$, and each of the conductive strips $8ba$ and $8bb$ is shaped like steps. Namely, the conductive strip $8ba$ is divided into three sections $8bc$, $8bd$ and $8be$, and the conductive strip $8bb$ is also divided into three sections $8bf$, $8bg$ and $8bh$. The three sections $8bc$ to $8be$ are respectively paired with the three sections $8bf$ to $8bh$ for forming narrow, intermediate and wide pairs, and distance D1 of the narrow pair is smaller than distance D2 of the intermediate pair which in turn is smaller than distance D3 of the wide pair. The narrow, intermediate and wide pairs are respectively associated with the narrow, intermediate and wide sections $8aa$, $8ab$ and $8ac$, and are respectively spaced apart from the narrow, intermediate and wide sections $8aa$, $8ab$ and $8ac$ by predetermined gaps G1, G2 and G3. Contact areas $8bi$, $8bl$, $8bm$ and $8bp$ are provided on both sides of the conductive strips $8ba$ and $8bb$, and other contact areas $8bj$, $8bk$, $8bn$ and $8bo$ are further provided between the sections $8bc$, $8bd$, $8be$, $8bf$, $8bg$ and $8bh$. In this instance, the narrow, intermediate and wide pairs are respectively assigned to the through-holes $6a$, $6b$ and $6c$, and the electrically conductive test pattern 8 is formed on the peripheral zone $5b$ before formation of the through-holes $6a$ to $6c$. The widths W1 to W3, the gaps G1 to G3 and the distances D1 to D3 are selected in such a manner that the diameter of each of the through-holes $6a$ to $6c$ on the design specification 7 is larger than the corresponding width W1, W2 or W3 and smaller than the total length of the corresponding width and the associated gap G1, G2 or G3.

Figure 4:
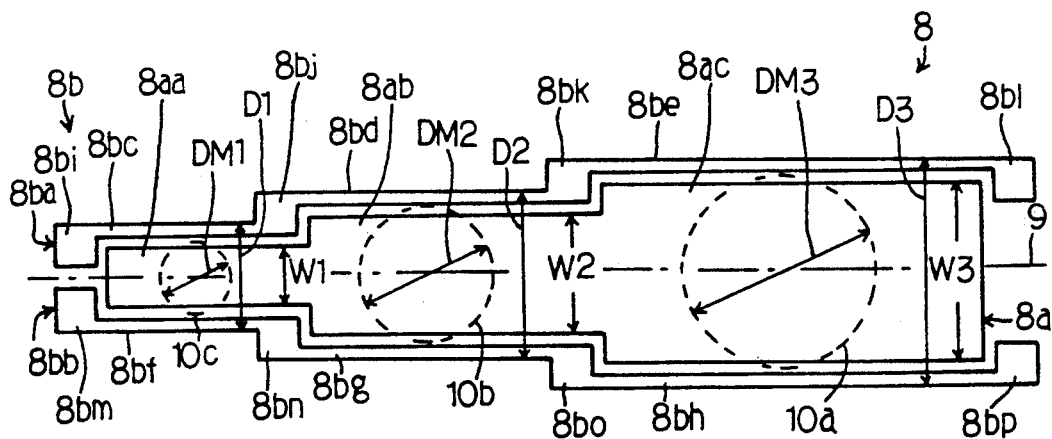
FIG. 4 is a plan view showing relation between the electrically conductive test pattern and through-holes.

When the through-holes 6a to 6c are formed in the central zone 5a, test holes 10a, 10b and 10c are simultaneously formed in the electrically conductive test pattern 8 with the same drills as shown in FIG. 4. The test holes 10a to 10c are respectively equal in diameter to the through-holes 6a to 6c. For example, if the design specification 7 indicates that the through-holes 6c, 6b and 6c should be DM1, DM2 and DM3 in diameter, the test holes 10c, 10b and 10a are preferably formed in such a manner that the centers of the test holes 10a to 10c are aligned with the center axis 9. If the drills are correct, each of the test holes 10a to 10c splits the corresponding section 8aa, 8ab or 8ac into disconnected two pieces. However, the correct drill does not break the corresponding narrow, intermediate or wide pair.

Figure 5A:
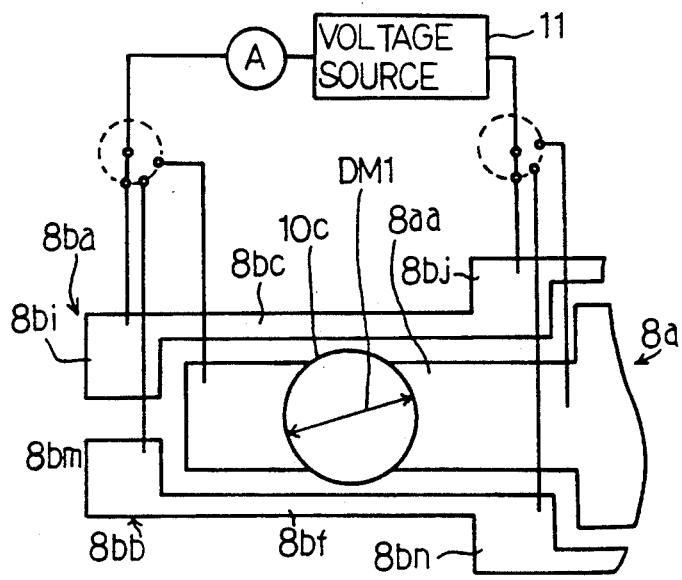
FIG. 5A to 5C are plan views showing the relation between the electrically conductive test pattern and various test holes.
Figure 5B:
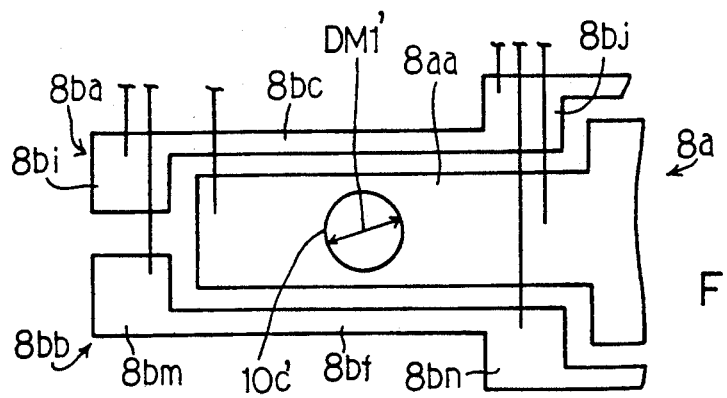
Figure 5C:
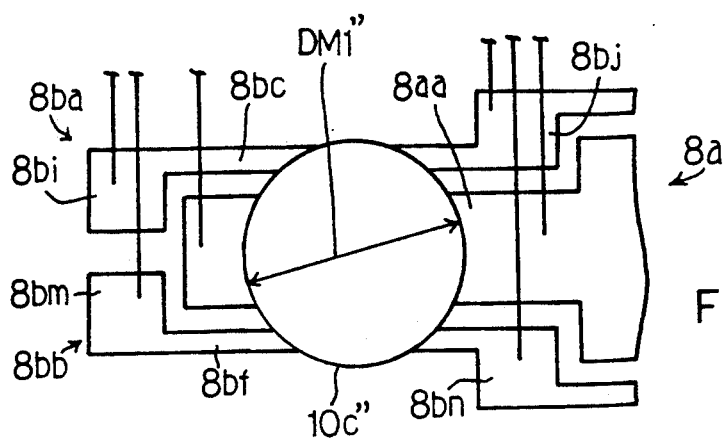

FIGS. 5A to 5C illustrate the testing operation. Although FIGS. 5A to 5C focuses the testing operation on the narrow section 8aa and the narrow pair, the intermediate section 8ab and the wide section 8ac and the associated intermediate and wide pairs are analogous thereto. FIG. 5A shows the test hole 10c formed with the correct drill, and the test hole 10c splits the narrow section 8aa into two pieces. However, the test hole 10c never breaks the sections 8bc and 8bf. In this situation, if a voltage source 11 is sequentially coupled between the contact areas 8bi/8bj, the two split pieces and the contact areas 8bm/8bn, the sections 8bc and 8bf allow current to flow between the contact areas 8bi and 8bj and between the contact areas 8bm and 8bn. However, current never flows between the two split pieces of the narrow section 8aa.

Assuming now that the through-holes 6c and, according, the test hole 10c' are mistakenly formed with a drill thinner than the correct drill, the test hole 10c' can not split the narrow section 8aa, and the sections 8bc and 8bf are never naturally broken as shown in FIG. 5B, because the inside diameter DM1' is smaller than the width W1 and, accordingly, than the distance D1. In this situation, the sections 8bc and 8bf as well as the narrow section 8aa provide respective electric paths between the associated contact areas, and, accordingly, current is detectable.

If the through-holes 6c and the test hole 10c" are formed with thick drills, the test hole 10c" splits not only the narrow section 8aa but also the sections 8bc and of as shown in FIG. 5C, because the inside diameter DM1" of the test hole 10c" is larger than the width W1 and, accordingly, than the distance D1. For this reason, current never flow. Table 1 summarizes the test operation.

TABLE 1

|  | thin drill | correct drill | thick drill |
| --- | --- | --- | --- |
| sections 8bc & 8bf | current flows | current flows | current is blocked |
| sections 8aa–8ac | current flows | current is blocked | current is blocked |

The above described test operation is assumed that the centers of the test holes 10a to 10c are aligned with the center axis 9. Even if the centers of the test holes 10a to 10c are deviated from the center axis in either direction to the conductive strip 8ba or 8bb, a through-hole and a corresponding test hole out of the specification are detectable with the combination of the inner conductive sub-pattern 8a and the outer conductive sub-patter 8b implemented by the two conductive strips 8ba and 8bb, because the deviation usually results in breakage of either conductive strip 8ba or 8bb.

Second Embodiment

Figure 6:
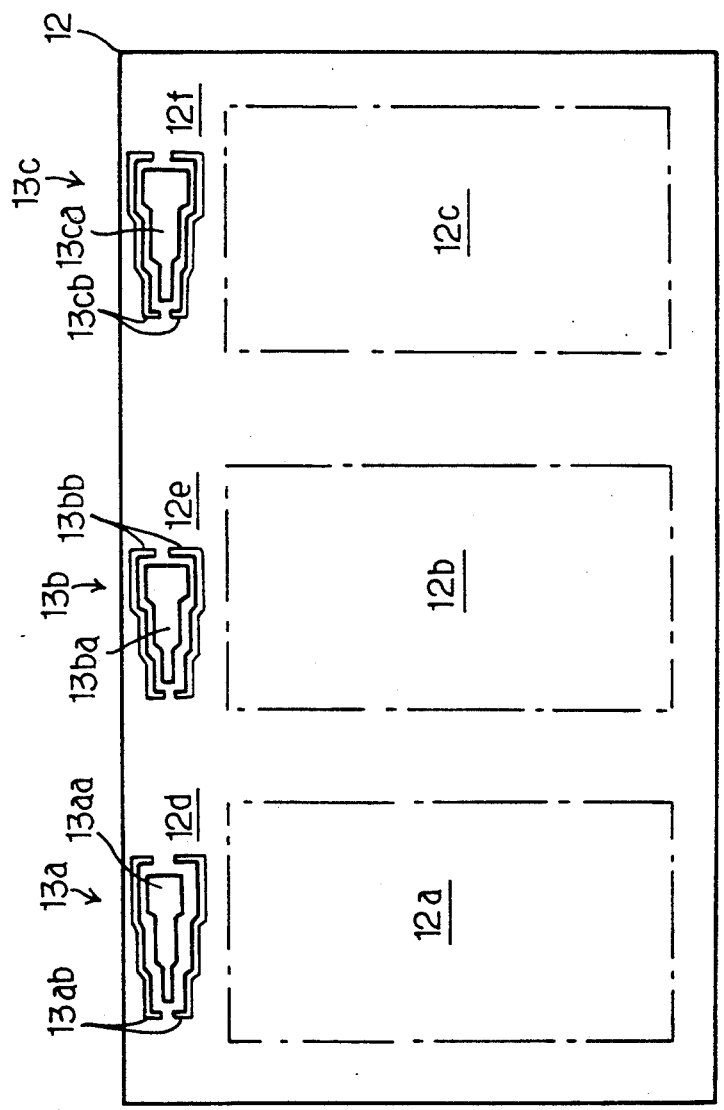
FIG. 6 is a plan view showing another printed wiring board according to the present invention.

Turning to FIG. 6 of the drawings, another printed wiring board 12 embodying the present invention is illustrated, and the printed wiring board 12 has a major surface with three central zones 12a, 12b and 12c respectively associated with peripheral zones 12d, 12e and 12f. Though not shown in the drawings, three kinds of through-holes are formed in each of the central zones 12a to 12c, and are respectively associated with test patterns 13a, 13b and 13c. Each of the test patterns 13a to 13c is implemented by an inner conductive sub-pattern 13aa, 13ba or 13ca and an outer conductive sub-pattern 13ab, 13bb or 13cb shaped into steps. The dimensions of the conductive sub-patterns 13aa/13ab, 13ba/13bb or 13ca/13cb and the relative relation therebetween are similar to those of the electric test pattern 8, and no further description is incorporated hereinbelow for the sake of simplicity.

If the through-holes formed in the three central zones 12a to 12c are different in inside diameter from one another, the test patterns 13a to 13c are formed in different dimensions, and the printed wiring board implementing the second embodiment can cope with a wide variety of through-holes formed on the major surface without complex configuration of test pattern.

Although particular embodiments of the present invention have been shown and described, it will be obvious to those skilled in the art that various changes and modifications may be made without departing from the spirit and scope of the present invention. For example, if the center of the test holes are aligned with the center axis at all times, the outer conductive sub-pattern may be implemented by either conductive strip.

What is claimed is:

1. A printed wiring board comprising
   a) a board member having a major surface virtually broken down into a first zone and a second zone, at least one through-hole being open at said first zone of said major surface, said at least one through-hole having a first predetermined diameter; and
   b) an electrically conductive test pattern formed on said second zone of said major surface, and having a first conductive sub-pattern and a second conductive sub-pattern spaced apart from each other by a first predetermined gap, a first test hole of said first predetermined diameter being formed in said first conductive sub-pattern in such a manner as to split said first conductive sub-pattern into two disconnected pieces without breakage of said second conductive sub-pattern in so far as said first predetermined diameter is matched with a design specification.

2. A printed wiring board as set forth in claim 1, in which said second conductive sub-pattern is implemented by a pair of conductive strips respectively spaced apart from both sides of said first conductive sub-pattern by said first predetermined gap.

3. A printed wiring board as set forth in claim 2, in which said first conductive sub-pattern has a first width smaller than said first predetermined diameter, and said pair of conductive strips have respective outer edges spaced apart by a first predetermined distance larger than said first predetermined diameter.

4. A printed wiring board as set forth in claim 3, in which said first conductive sub-pattern has a narrow section with said first width and a wide section with a second width larger than said first width, and in which said pair of conductive strips have respective first sections with said outer edges spaced apart by said first predetermined distance and respective second sections with outer edges spaced apart from each other by a second predetermined distance, another through-hole with a second predetermined diameter being open said first zone, a second test hole with said second predetermined diameter being formed in association with said wide section and with said second sections, said second predetermined diameter being larger than said second width and smaller than said second predetermined distance if said another through-hole and said second test hole are matched with said design specification.

5. A printed wiring board as set forth in claim 1, in which said printed wiring board has a plurality of central zones with respective through holes, and a plurality of peripheral zones with respective electrically conductive test patterns and respectively associated with said central zones, each of said respective through-holes being similar to said at least one through-hole, each of said respective electrically conductive test patterns being similar to said electrically conductive test pattern formed in said second zone.

* * * * *